United States Patent [19]
Han

[11] Patent Number: 5,424,240
[45] Date of Patent: Jun. 13, 1995

[54] METHOD FOR THE FORMATION OF FIELD OXIDE FILM IN SEMICONDUCTOR DEVICE

[75] Inventor: Chung S. Han, Bubaleub, Rep. of Korea

[73] Assignee: Hyundai Electronics Industries Co., Ltd., Bubaleub, Rep. of Korea

[21] Appl. No.: 220,097

[22] Filed: Mar. 30, 1994

[30] Foreign Application Priority Data

Mar. 31, 1993 [KR] Rep. of Korea ............... 1993-5465

[51] Int. Cl.⁶ ............................................. H01L 21/76
[52] U.S. Cl. ......................................... 437/67; 437/72
[58] Field of Search ............................ 437/72, 67; 148/DIG. 85, DIG. 86

[56] References Cited

U.S. PATENT DOCUMENTS 4,666,556  5/1987  Fulton et al. ................. 156/643

FOREIGN PATENT DOCUMENTS

| 61-67933 | 4/1986 | Japan . |
| 199230 | 4/1989 | Japan . |
| 2119238 | 5/1990 | Japan . |
| 373530 | 3/1991 | Japan ............. 437/72 |
| 3286525 | 12/1991 | Japan . |

OTHER PUBLICATIONS

IBM Tech. Disc. Bull., vol. 32, No. 10A, Mar. 1990, pp. 90-91.

*Primary Examiner*—George Fourson
*Attorney, Agent, or Firm*—Darby & Darby

[57] ABSTRACT

A method for the formation of field oxide film in a semiconductor device is disclosed.

The method comprises the steps of: forming a first nitride film on a silicon substrate, the silicon substrate being previously covered with a pad oxide film; applying etch to the nitride film, the pad oxide film and the silicon substrate in due order, so as to form a trench in a predetermined portion; depositing a polysilicon film entirely on the resulting structure, so as to cover the trench and the nitride film; subjecting the polysilicon film to planarization; forming a second nitride film on the plane polysilicon film and etching back the second film, so as to form a spacer nitride film at either side wall of the first nitride film; etching the plane polysilicon film filling the trench, so as to expose a predetermined portion of the trench, the spacer nitride film and the first nitride film being used as an etch mask; forming a field oxide film in the trench by use of an oxidation process and removing the first nitride film, the spacer nitride film and the pad oxide film.

The method is preventive of the stress on silicon substrate and the occurrence of defective in device, whereby highly integrated devices can be fabricated.

6 Claims, 4 Drawing Sheets

METHOD FOR THE FORMATION OF FIELD OXIDE FILM IN SEMICONDUCTOR DEVICE

BACKGROUND OF THE INVENTION

1. Field of the Invention

The present invention relates, in general, to a method for the formation of device separation film among manufacture processes for a semiconductor device and, more particularly, to a method for forming a field oxide film in the semiconductor device, capable of diminishing the stress of a silicon substrate and improving the separation characteristic of the semiconductor device.

2. Description of the Prior Art

For better understanding of the background of the present invention, there will be given the description for a conventional method for forming a device separation film in a semiconductor device, with reference to FIG. 1.

As shown in FIG. 1, a silicon substrate 1 is covered with a pad oxide film 2 which is subsequently overlaid with a nitride film 3. An etching process is carried out to open predetermined portion of the nitride film 3 in which a field oxide film is to be formed, leaving a pattern of the nitride film 3.

Thereafter, another nitride film is deposited on the opened portion, so as to form a spacer film 7 at either side wall thereof. Using the spacer film 7 and the nitride film 3 as an etch mask, a trench is formed in the silicon substrate 1, to which a wet oxidation process is subsequently applied, in order to form a field oxide film (not shown in this figure).

In the conventional process for forming a field oxide film, however, there occurs a problem in that the silicon atoms in the silicon substrate are replaced with impurities since the silicon substrate is rapidly oxidized as the oxidation process is directly carried out on the silicon substrate at high temperatures. What is worse, a bird's beak comes to forms thick with the conventional method, making the surface of the field oxide film rough and increasing a leak current.

SUMMARY OF THE INVENTION

For solving the above problems encountered in prior arts, the present inventors have recognized that there is need a novel method for the formation of field oxide film in a semiconductor device preventive of the increaser of leak current and improved in reliability.

Accordingly, it is an object of the present invention to provide a method for the formation of field oxide film in a semiconductor device, capable of diminishing the factor of generating the bird's beak so as to obtain larger active region in the device.

It is another object of the present invention to provide a method for the formation of field oxide film in a semiconductor device, preventable of the substitution of silicon atoms with other atoms when carrying out the oxidation of a silicon substrate at high temperatures.

It is a further object of the present invention to provide a method for the formation of field oxide film in a semiconductor device, efficient for diminishing the occurrence of the defect caused by oxygen in a silicon substrate.

It is still another object of the present invention provide a method for the formation of field oxide film in semiconductor device, capable of improving the separation characteristic of the device.

In accordance with the present invention, the above objects can be accomplished by providing a method for the formation of field oxide film in a semiconductor device, comprising the steps of: forming a first nitride film on a silicon substrate, the silicon substrate being previously covered with a pad oxide film; applying etch to the nitride film, the pad oxide film and the silicon substrate in due order, so as to form a trench in a predetermined portion depositing a polysilicon film entirely on the resulting structure, so as to cover the trench and the nitride film; subjecting the polysilicon film to planarization; forming a second nitride film on the plane polysilicon film and etching back the second film, so as to form a spacer nitride film at either side wall of the first nitride film; etching the plane polysilicon film filling the trench, so as to expose a predetermined portion of the trench, the spacer nitride film and the first nitride film being used as an etch mask; forming a field oxide film in the trench by use of an oxidation process and removing the first nitride film, the spacer nitride film and the pad oxide film.

BRIEF DESCRIPTION OF THE DRAWINGS

The above objects and other advantages of the present invention will become more apparent by describing in detail the preferred embodiment of the present invention with reference to the attached drawings in which.

DETAILED DESCRIPTION OF THE PREFERRED EMBODIMENT

Figure 1:
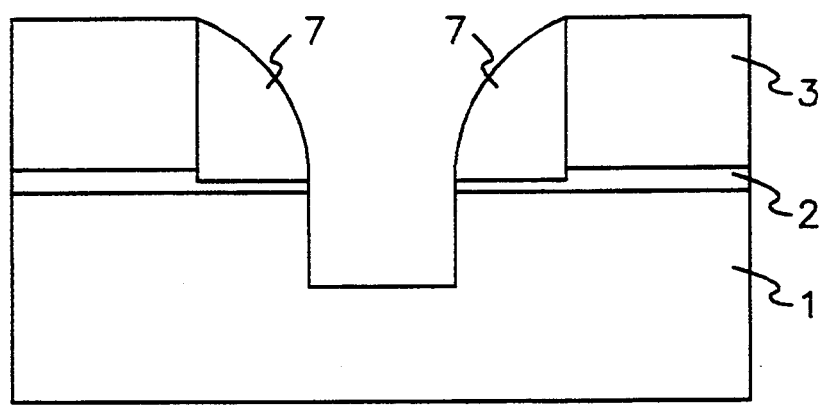
FIG. 1 is a partial cross-sectional plan view showing a conventional method for the formation of field oxide film in a semiconductor device.

Hereinafter, the preferred embodiment of the present invention will be, in detail, described with reference to the accompanying drawings, wherein like reference numerals designate like parts, respectively.

Figure 2A:
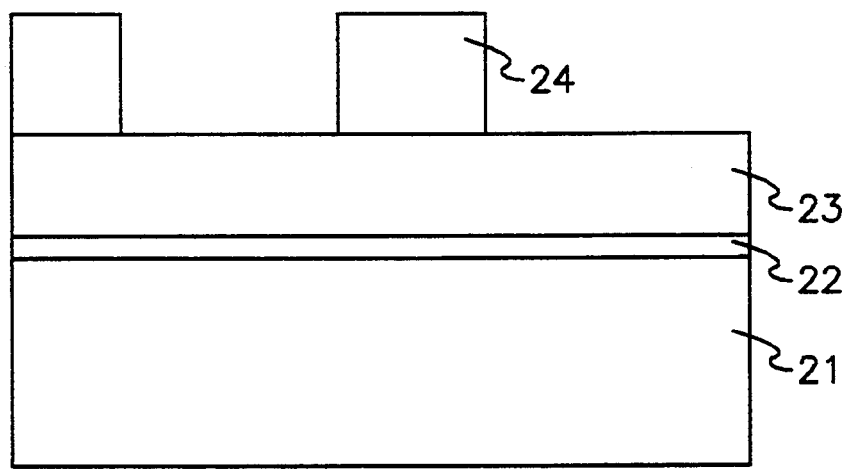
FIGS. 2A through 2G are partial cross-sectional plan views showing a method for the formation of field oxide film in a semiconductor device, according to the present invention.

As shown in FIG. 2A, a silicon substrate 21 is initially covered with a pad oxide film 22, which is subsequently overlaid with a nitride film 23 by using a chemical vapor deposition (hereinafter, referred to as "CVD") process. This figure also shows a photosensitive pattern 24 formed on the nitride film 23. It is to settle the portions where a field oxide film is to be formed.

Figure 2B:
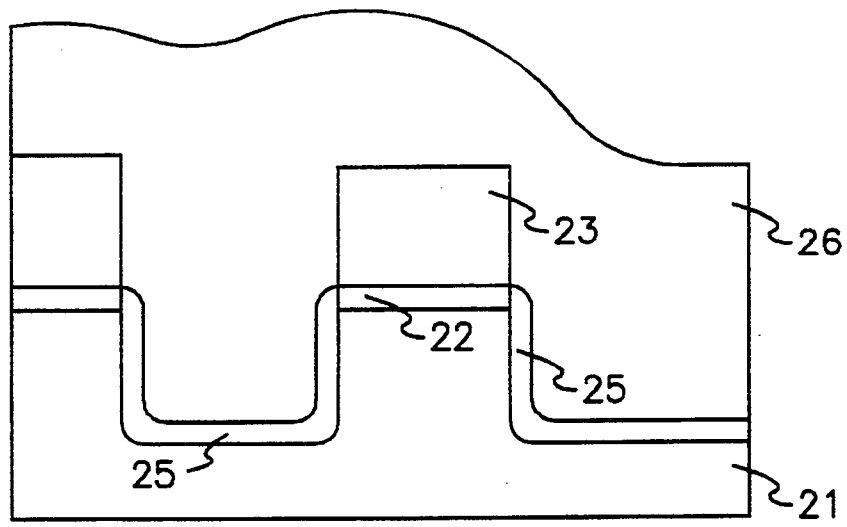

Using the photosensitive pattern 24 as an etching mask, the nitride film 23, the pad oxide film 22 and the silicon substrate 21 are etched in due order, so as to form a trench, as shown in FIG. 2B. This etching step is performed to such a degree that the trench is approximately 1,000 to approximately 3,000 Å deep. Following the formation of the properly deep trench, the photosensitive pattern 24 is removed and the silicon substrate 21 exposed is further subjected to oxidation, so as to form an oxide film 25 with a thickness of approximately 100 to approximately 500 Å. Thereafter, there is formed a polysilicon film 26 on the entire surface of the resulting structure. At this time, the polysilicon film formed on the trench should be allowed to be higher than the nitride film 23.

Figure 2C:
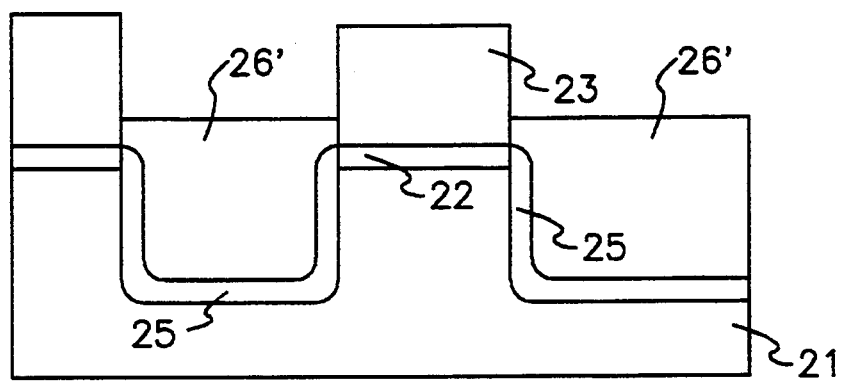

Subsequently, the polysilicon film 26 is subjected to planarization with a chemical mechanical polishing process and then, subjected to dry etch, so as to form a plane polysilicon film 26' which is somewhat higher than the pad oxide film 22, as shown in FIG. 2C.

Of great importance is this controlled height of the plane polysilicon film 26. That is, when a field oxide film is formed in the trench, the higher plane polysilicon film 26' can allow the field oxide film to be formed higher than the pad oxide film 22, preventing a problem in that, after a cleaning step for sacrificial oxide film formation process, the field oxide film comes to be lower than the pad oxide film 22. What is better still, since oxygens do not directly move between the silicon substrate 21 and the nitride film 23 due to the controlled height of the plane polysilicon film 26, there is effected the diminution of the bird's beak.

Figure 2D:
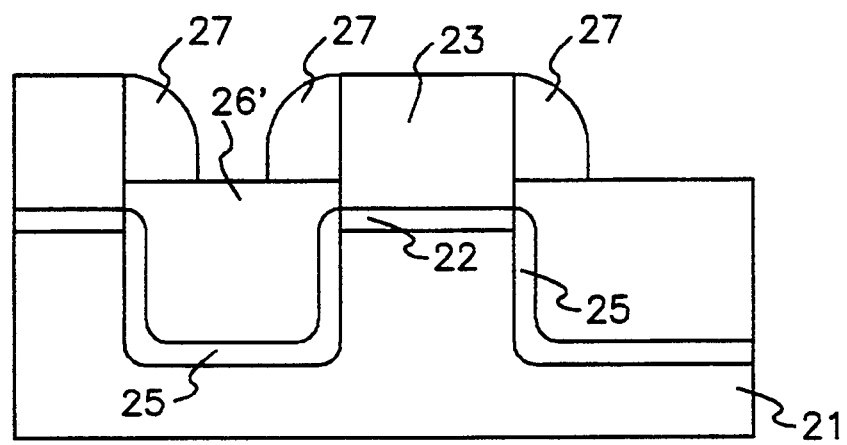

In succession, on the resulting structure, there is formed another nitride film which turns into a spacer nitride film 27 at either side wall of the nitride film 23, as shown in FIG. 2D.

Figure 2E:
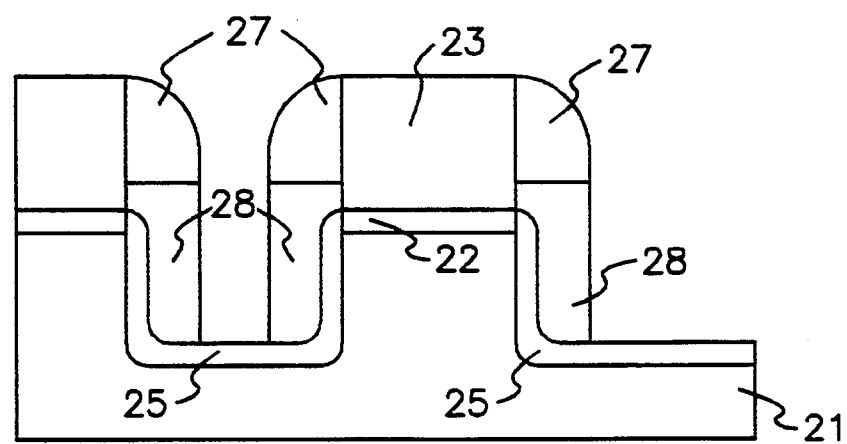

Thereafter, using the nitride film 23 and the spacer nitride film 27 as an etch mask, the plane polysilicon film 26' filling the trench is etched at a predetermined portion, so as to form a spacer polysilicon film 28 at either side wall of the trench, as shown in FIG. 2E. As a result, this trench exposes the silicon substrate in a narrower range than was previously formed.

Figure 2F:
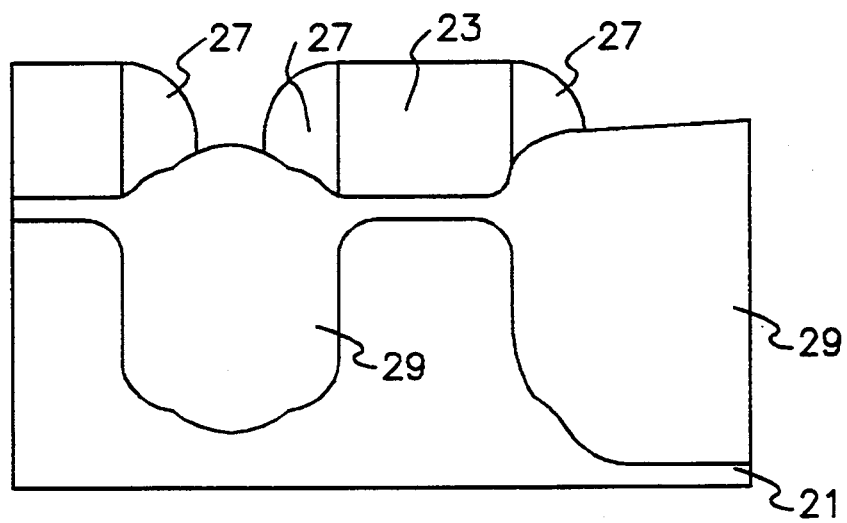
Figure 2G:
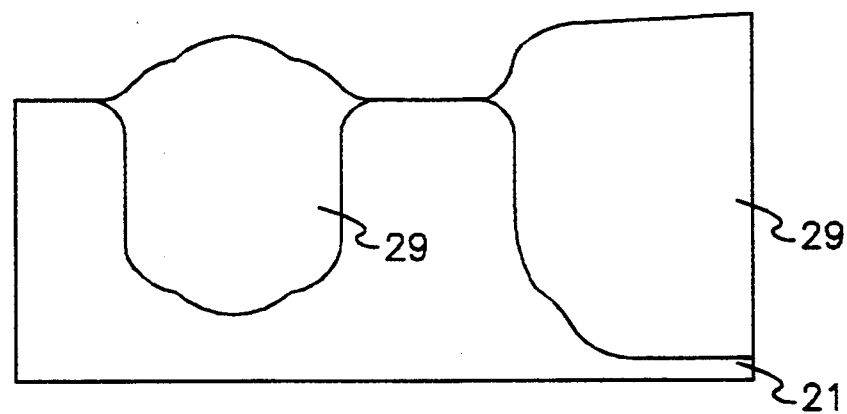

Following this, an oxidation process is applied at high temperatures ranging from approximately 1,000° to approximately 1,200° C., in order to form a field oxide film 29, as shown in FIG. 2F.

During this application, the spacer polysilicon film 28 formed at either side wall of the trench is oxidized and grown and finally meets each other at the central portion of the trench. This meeting results in the restriction of the oxidation.

Since the oxidation process is carried out at the high temperatures, there appears a viscous flow phenomenon in the field oxide film 29 formed in the trench, leading to the diminution of the stress on the silicon substrate 21 by virtue of the field oxide film 29. In addition, when the field oxide film 29 is formed, the spacer polysilicon film plays a role of buffing, lessening the stress delivered to the silicon substrate 21. What is better still, the substitution of silicon caused by the rapid oxidation process is absorbed into the grain boundary of the spacer polysilicon film 28, the interface of the silicon substrate 21 and the spacer polysilicon film 28 and the interface of the interface of the oxide film 25 and the spacer polysilicon film 28, so that few drawbacks are generated. At this time, as depicted in FIG. 2F, the field oxide film of the right portion having a wide field range is grown higher than that of the left portion having narrow field range, both the field oxide films being higher than any part of the silicon substrate.

Finally, the nitride film 23 and the spacer nitride film 27 are removed with a hot phosphoric acid solution, and then, the pad oxide film 22 left is also removed, so as to form a desired field oxide film.

According to the method of the present invention, the device separation film of a semiconductor device is able to buff the stress caused by the oxidation by virtue of the use of the spacer polysilicon film.

In addition, oxygen, which is a main factor causing the substitution of silicon in forming a field oxide film is absorbed, so that the device can be separated without defect in accordance with the present invention.

Furthermore, even if a gate is formed, the field oxide film provided by the method of the present invention can be maintained higher than the silicon substrate, thereby improving the separation characteristics of the device. Consequently, the method according to the present invention is suitable to the device separation of a highly integrated device of 64M DRAM or more.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for the forming of field oxide film in a semiconductor device, comprising the steps of:
    forming a first nitride film over a silicon substrate, said silicon substrate being covered with a pad oxide film;
    etching said nitride film, said pad oxide film and said silicon substrate in order, so as to form a trench in a portion;
    depositing a polysilicon film entirely on the resulting structure, so as to cover said trench and said nitride film;
    subjecting said polysilicon film to planarization;
    forming a second nitride film on the planarized polysilicon film and etching back the second film, so as to form a spacer nitride film at either side wall of said first nitride film;
    a second etching step of etching said planarized polysilicon film filling said trench, so as to expose a predetermined portion of said trench, said spacer nitride film and said first nitride film being used as an etch mask;
    forming a field oxide film in said trench by oxidizing the resulting structure and removing said first nitride film, said spacer nitride film and said pad oxide film.

2. A method according to claim 1, wherein said trench is approximately 1,000 to approximately 3,000 Å deep.

3. A method according to claim 1, wherein the surface of said polysilicon film which is deposited in said trench in advance of said planarization is higher than the surface of said first nitride film.

4. A method according to claim 1, wherein said second etching step comprises etching said polysilicon film, in back of said planarization for said polysilicon film, to such a degree that the surface of said planarized polysilicon is not lower than the surface of said pad oxide film.

5. A method according to claim 1, wherein said planarization is carried out by use of a chemical mechanical polishing process.

6. A method according to claim 1, wherein said oxidation process for forming said, field oxide film is carried out at temperatures ranging from approximately 1,000° to approximately 1,200° C.

* * * * *